(12) United States Patent
Parenteau et al.

(10) Patent No.: US 6,515,598 B2
(45) Date of Patent: Feb. 4, 2003

(54) SYSTEM AND METHOD FOR COMPRESSING AND DECOMPRESSING DATA IN REAL TIME

(75) Inventors: Guillaume Parenteau, Drummondville (CA); Michel Levesque, Trois-Rivières (CA); Guillaume Plante, Trois-Rivières (CA)

(73) Assignee: Cilys 53, Inc., Trois-Rivieres (CA)

( * ) Notice: Subject to any disclaimer, the term of this patent is extended or adjusted under 35 U.S.C. 154(b) by 0 days.

(21) Appl. No.: 10/021,893

(22) Filed: Dec. 13, 2001

(65) Prior Publication Data

US 2002/0140583 A1 Oct. 3, 2002

Related U.S. Application Data

(60) Provisional application No. 60/257,101, filed on Dec. 22, 2000.

(51) Int. Cl.[7] .................................................. H03M 7/00
(52) U.S. Cl. ......................................................... 341/60
(58) Field of Search .......................... 341/60, 106, 51; 704/500; 345/719

(56) References Cited

U.S. PATENT DOCUMENTS

| | | | |
|---|---|---|---|
| 4,701,745 A | 10/1987 | Waterworth | 340/347 |
| 4,906,991 A | 3/1990 | Fiala et al. | 341/51 |
| 4,955,066 A | 9/1990 | Notenboom | 382/56 |
| 5,001,478 A | 3/1991 | Nagy | 341/67 |
| 5,003,307 A | 3/1991 | Whiting et al. | 341/51 |
| 5,016,009 A | 5/1991 | Whiting et al. | 341/67 |
| 5,049,881 A | 9/1991 | Gibson et al. | 341/95 |
| 5,051,745 A | 9/1991 | Katz | 341/51 |
| 5,126,739 A | 6/1992 | Whiting et al. | 341/106 |
| 5,140,321 A | 8/1992 | Jung | 341/55 |
| 5,155,484 A | 10/1992 | Chambers, IV | 341/55 |
| 5,455,577 A | 10/1995 | Slivka et al. | 341/51 |
| 5,710,895 A * | 1/1998 | Gerber | 345/719 |
| 6,252,830 B1 * | 7/2001 | Hsu | 704/500 |

OTHER PUBLICATIONS

Khalid Sayood, Introduction to Data Compression (Second Edition), 2000, USA.
Jerry Gibson et al., Digital Compression for Multimedia, 1998, USA.

* cited by examiner

*Primary Examiner*—Brian Young
(74) *Attorney, Agent, or Firm*—Bourque & Associates, P.A.

(57) ABSTRACT

A system and method for compressing and decompressing data in real time begins by taking a character string from an input string, generating a hash value of the character string which is utilized in a look up table to address a chained array or list of previously matching character strings. The array is updated if there is another.matching character string found when compressing the input string. A token generator writes a code to the output string indicating whether or not that there has been a match. The token generator generates an indication of the length of the character string not compressed, the one or more characters string not compressed, the length of a matching character string, and the number of characters processed since the last match. These values generated by the token generator are optimally represented based upon preselected criteria.

14 Claims, 17 Drawing Sheets

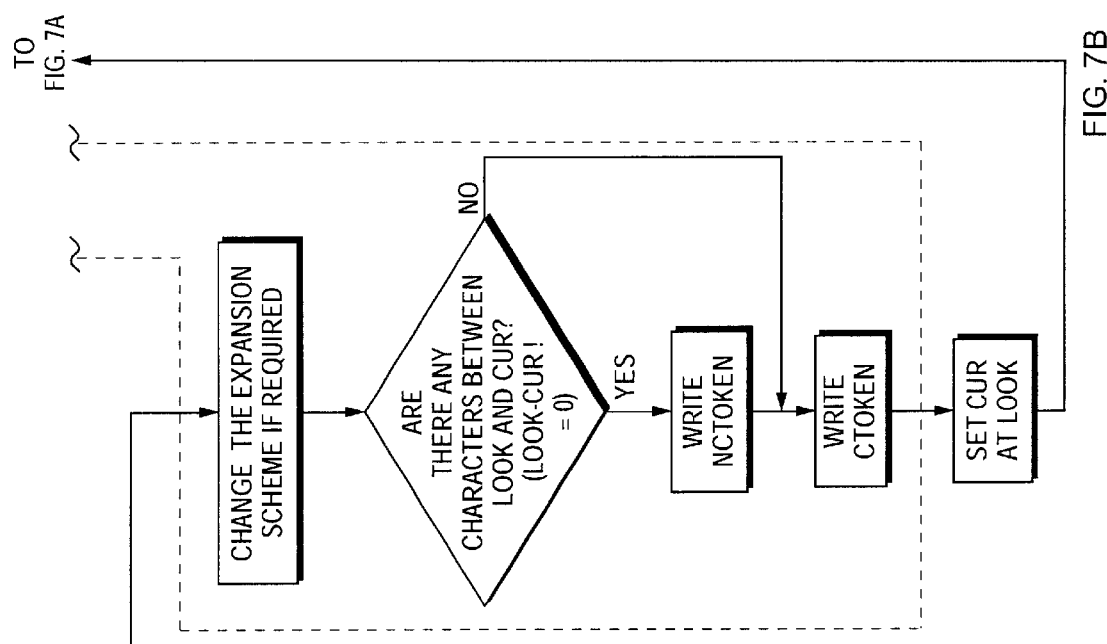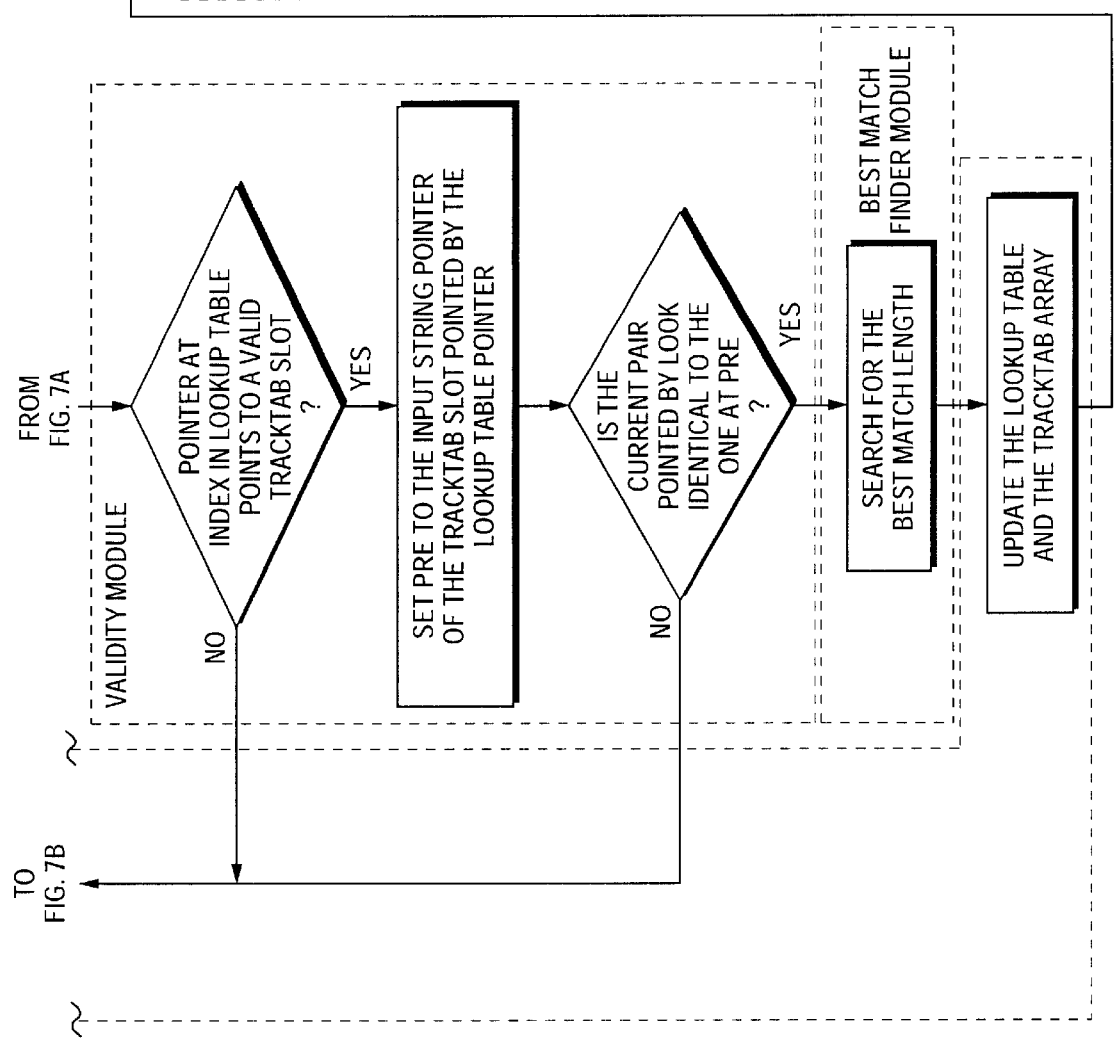

SYSTEM AND METHOD FOR COMPRESSING AND DECOMPRESSING DATA IN REAL TIME

This application claims the benefit of provisional application 60/257,101 filed Dec. 22, 2002.

FIELD OF THE INVENTION

The present invention relates to a system and method for compressing and decompressing data in real time.

BACKGROUND OF THE INVENTION

Data compression is possible because the data people normally use contains a lot of redundancy, that is, parts of the data are repeated throughout the whole message. Two major types of compression algorithms exist, lossless compressors and lossy compressors. The difference between the two is that lossy algorithms lose information about the data in the process of compression and therefore cannot decompress the data exactly as it was. Lossless compression algorithms can be separated in two different classes, statistical methods and dictionary methods. The present invention is based on a lossless dictionary algorithm.

Lossless compression and decompression algorithms are well known in the art. Reference may be made for example to the LZ77 algorithm, and its variations (see for example U.S. Pat. Nos. 5,155,484 (Chambers), U.S. Pat. No. 4,701,745 (Waterworth) and U.S. Pat. No. 5,521,597 (Dimitri), to name a few).

The LZ77 compression algorithm reduces the length of messages by replacing repeated patterns of data by references to those patterns of data. The references are given with a pair of numbers, the length of the repeated data and its "offset" from the previous occurrence. For example, the string "abracadabra" would be compressed as "<abracad><4,7>" meaning that the first seven characters contained no repeated data and that the last three could be referenced as a repetition of 4 characters 7 characters back in the string. Four characters (32 bits) were replaced by a pair (2) of numbers sometimes called a reference. Compression therefore occurs if one is able to express the two numbers in less than 32 bits. Since bits have no meaning unless a given representation exists, one also has to be able to differentiate between a pair of numbers and a sequence of normal characters (this is denoted by the <> symbols). This means that additional bits are needed to determine if bits represent a reference or actual characters.

This type of algorithm, and its derivatives, are efficient when it comes to compressing a whole file. Indeed, one of the characteristics of the LZ77 algorithm is that it requires a "static" file to be able to perform compression.

With the advent of the Internet, however, communications between two or more users are more and more frequent. These communications are either uncompressed or compressed. Compressed communications require the user to perform a compression of the file prior to sending the communication, and require the receiver to perform decompression to read the communication. On the other hand, uncompressed communications require a large bandwidth.

There is thus a need to preserve bandwidth on a communications networks while still allowing for data compressions, and more particularly, for a system and method to perform data compression and decompression in real time.

SUMMARY OF THE INVENTION

The present invention features a system and method for efficiently and quickly compressing and decompressing data in real time utilizing several novel approaches to data compression, including the dynamic representation of coded values.

One feature of the present invention processes characters by checking to see if they have been seen before in the input string. If they haven't, the present system and method adds them to a dictionary or table, and if they have, the system and method finds the longest match possible with the previous occurrence of the character(s) and the one(s) under examination. When a match is found, the present invention writes a representation of the characters that could not be compressed (if there are characters between the last match and this one) and a representation for the matching characters. This process is repeated until there are no characters left in the input string. The present system and method checks for previous encounters of one or more characters, and uses a lookup table for that purpose. The lookup table references simply linked lists of the same characters. The first node of the list references the most recent occurrence of the characters.

The present invention also utilizes a vector of integers called expansion schemes, which is a binary representation of the length of characters NOT compressed (nclen); the length of the matching characters (mlen); and the number of characters processed since the last match (offset). Expansion schemes produce variable length codes that are efficient in representing values that obey strictly decreasing probability distribution functions. Expansion schemes also provide a highly economical way, in terms of memory usage, of storing bit representations. Depending on the number of bytes that have been processed, the compressor changes its expansion schemes to reflect changes in the probability distribution of the lengths and offsets.

The decompressor associated with the present invention utilizes an input string comprised of tokens representing the original string. The output string will contain the decompressed string. The decompressor reads a token, if the token is an nctoken (a bit indicating a non-compressed sequence, the nclen and the characters themselves) then it reads the length of the sequence, copies those characters to the output string, reads the ctoken that follows and copies mlen characters at the given offset to the output string. If the token is a ctoken (a bit indicating the sequence, if it immediately follows another ctoken, and the match length and offset pair or mlen and offset in short form) it copies mlen characters at the given offset to the output string. This goes on until all of the tokens are read.

BRIEF DESCRIPTION OF THE DRAWINGS

These and other features and advantages of the present invention will be better understood by reading the following detailed description, taken together with the drawings wherein:

FIG. 8 is a detailed flow chart of the Write CToken subroutine of the present invention;

DESCRIPTION OF PREFERRED EMBODIMENT

The present invention is more specifically directed to a system and method for use in packet-based communications, although its use is not limited thereto. Generally, such communications include a header and the communication data. The present invention is directed to the compression and the decompression of the data itself, in order to reduce the bandwidth (i.e. time) required to send the message over a network. One of the important considerations of the present invention is that it be able to compress and decompress the data in real-time. Although the present invention will be described and explained as a series of computer software modules, this is not a limitation of the present invention, but merely represents one embodiment and the presently preferred embodiment.

The system and method of the present invention permits an average compression rate of 30% on a typical sampling of an internet communication using standard services such as "ftp", "http", "telnet", "flash", "Java", "streaming" and "mpeg". For example, with an initial communication session of 10 megabytes and an average compression rate of 30%, the information that is truly sent over for the network is 7 megabytes. The system and method of the invention thus permits an optimization of 1.4:1.

The compression rate is directly related to the nature of the information that is to be transmitted. It is therefore impossible to predict a constant compression rate during a transmission. If it happens that the nature of the information to be sent is incompressible and that the use of the system and method of the present invention would result in an increase of the size of the packet, the packet would be sent without being compressed.

The system and method of the present invention uses as its basis the LZ77 compression algorithm with important modifications and optimization which maximizes the compression ratio on restricted quantities of information (1,500 bytes in the case of Ethernet) in order to use it on the payload of a packet of information during its transmission. Furthermore, the performance has been increased in order to apply the compression in high-speed links.

Figure 1:
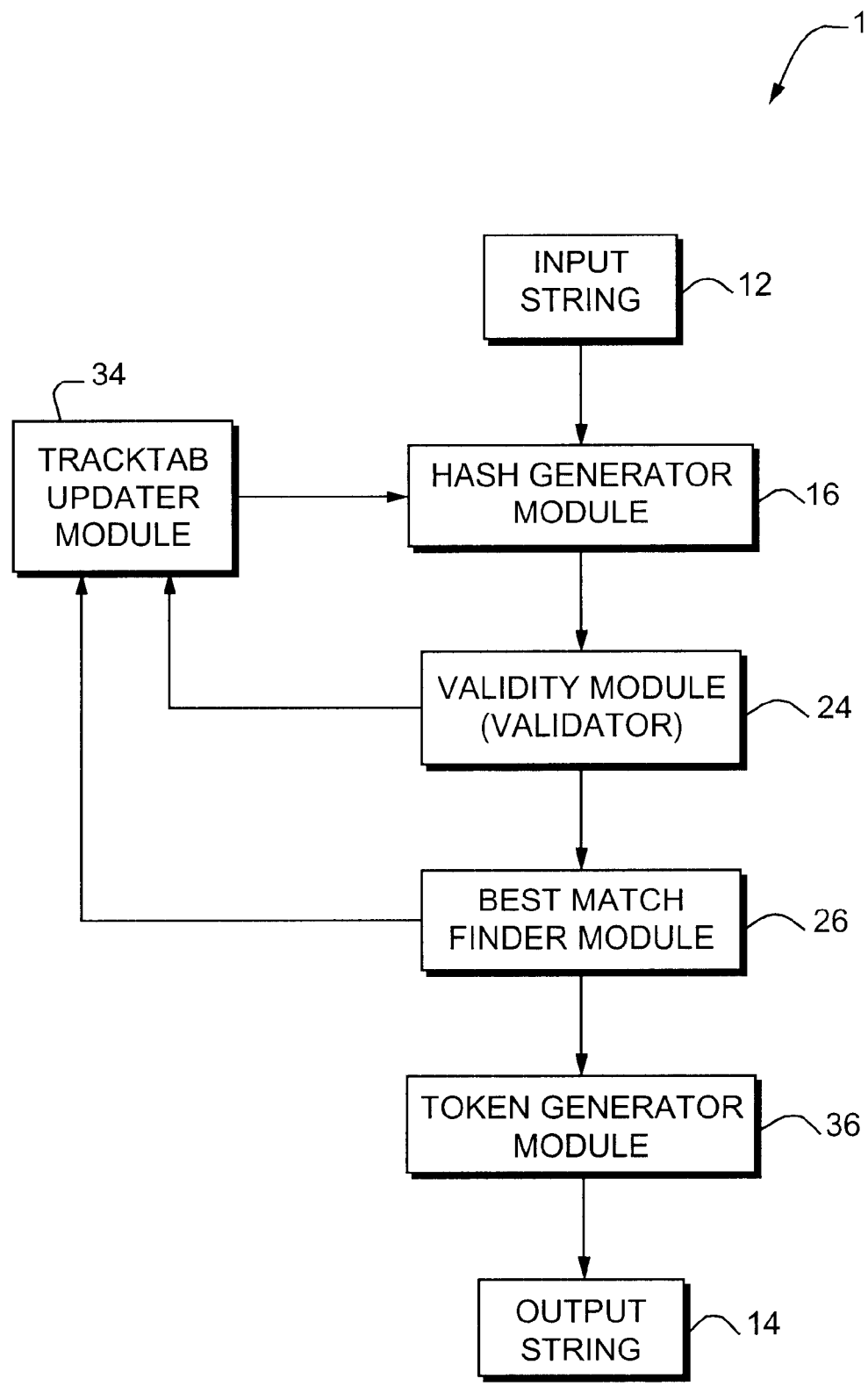
FIG. 1 is a block diagram of the compression system according to the present invention.

FIG. 1 is a block diagram 10 of the system for performing data compression in accordance with the teaching of the present invention. The input string 12 is a vector of eight bits characters (in this context, character means any possible value a field of eight bits could take, that is there exists $2^8=256$ possible characters). When compressing, this string contains the data to compress and the number of characters is known. When decompressing, this string contains the compressed string. The output string 14 is a vector of eight bits characters. When compressing, this string contains the compressed data. When decompressing, it contains the decompressed string.

Figure 4:
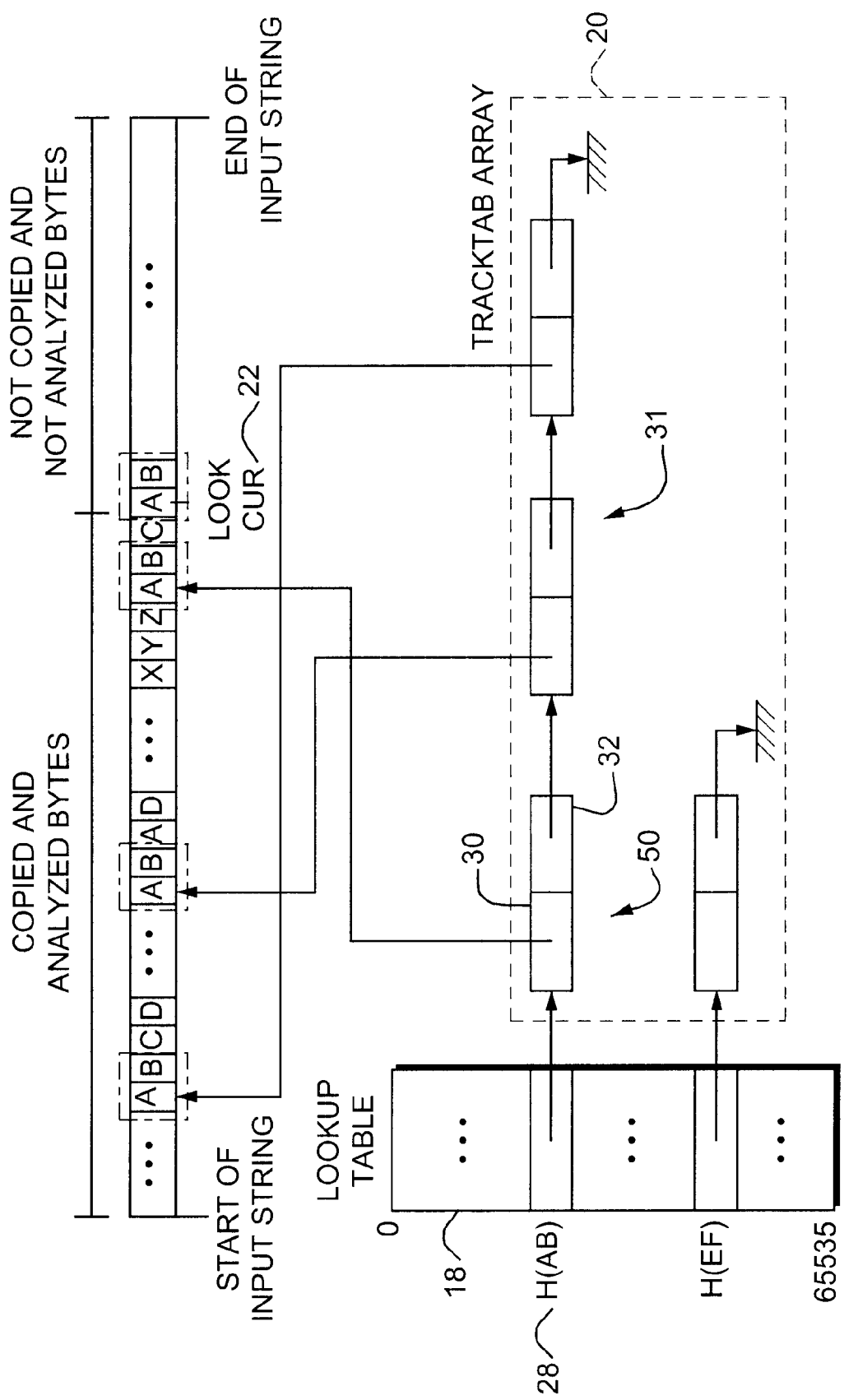
FIG. 4 is a schematic representation of structure manipulations including the lookup table and the tractable array which includes a chained list of matching character strings, in accordance with one feature of the present invention.

The hash generator is responsible for the calculation of indexes in the lookup table. The lookup table 18, FIG. 4, is an array of 65536 pointers to the tracking table (tractable 20). The lookup table 18 does not need to be initialized prior to compression. Indexes in the lookup table are calculated by the hash generator module. A valid pointer in the lookup table points to a slot in the tracking table containing a simply linked list of occurrences of the same pair of characters. The first element of the list is the most recently encountered. The validity of a pointer in the lookup table is checked by the validity module.

Figure 3:
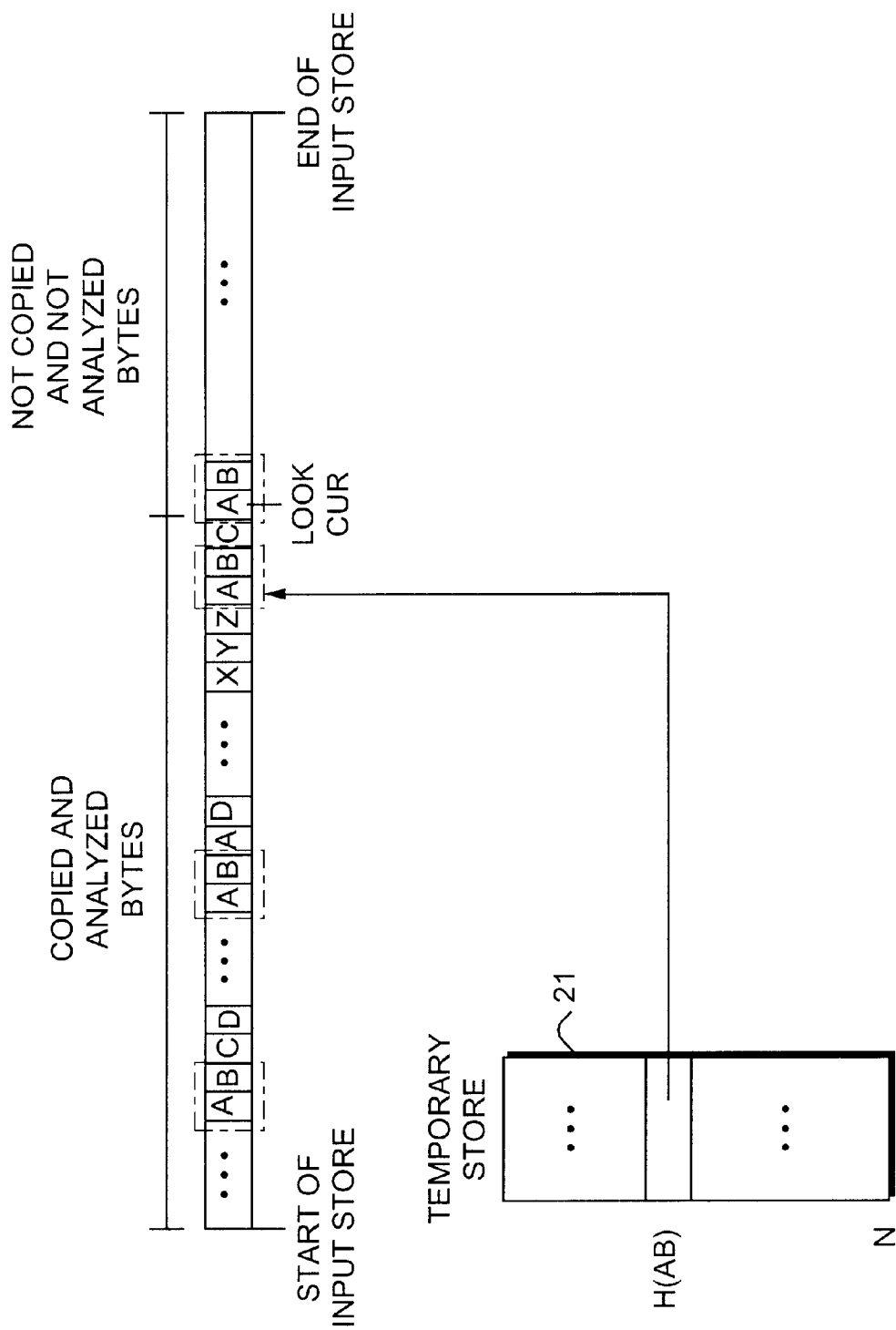
FIG. 3 is a schematic representation of structure manipulations including the temporary store structure of the prior art which makes reference to only the last occurrence of a matching character string.

The tracking table 20 is a structure that permits a sequential search to find the longest matching string within those already encountered that begin by the same pair of characters. Each tracktab slot contains: a pointer to the input store and a pointer to the previously encountered tracktab slot that has the same pair of characters hashed value. This means that each time a pair is encountered a new tracktab slot is created and linked with the previous one. The pointer in the lookup table is always pointing to the most recent occurrence of the pair of characters. In contrast, the prior art lookup table 21, FIG. 3, used with LZ77 compression and decompression algorithms only had one entry pointing only to the last occurrence of the pair of characters.

The hash generator 16 calculates the index according to the following: it is generated with the pair of characters currently under examination (character pointed to by look_cur 22, FIG. 4, and the next or following character). It is given by the concatenation of these two characters. Since each character is eight bits wide, the hash code is thus 16 bit wide yielding values between 0 and 65535. The index given by the hash generator module is used to access the pointer to the most recent tracktab slot which references the same pair of bytes as the one under examination (at look_cur).

The validity module (or validator) 24, verifies that a given pointer in the lookup table 18 is a valid pointer. To be a valid pointer, it has to reference a tracktab slot inside the tracking table 20 (between the start of the tracking table and the next available element), and the tracktab slot has to reference a pair of bytes that corresponds to its hash code. If these conditions are true, then the pointer in the lookup table 18 is valid and the slot it references in the tracktab is also valid.

The best match finder module 26 searches for a longest matching string by examining the tracktab array. The best match finder 26 starts at the tracktab slot pointed by the lookup table 18 entry. The entry in this tracktab will be the most recent occurrence of the matching character(s) under examination. The best match finder 26 will begin examining characters from the position pointed to in the tracktab slot to determine the maximum length of each possible match and return the position and length of the longest match by sequentially examining each tracktab slot in the chain pointed to by the lookup table entry 18 and each previous occurrence of the pair if characters under study.

The tracktab updater module modifies the tracking table 20 and the lookup table 18 in order for them to reference all possible occurrences of pair of characters previously seen in the input string. As mentioned earlier, each valid (as determined by the validity module 24) lookup table pointer 28, given by an index calculated by the hash generator 16 with a pair of characters, references a tracktab slot 30 of the most recent occurrence of this pair of characters. This slot also has a pointer 32 to the previous occurrence of the pair. The updater module 34 will create a new tracktab slot, initialize its character pointer to the position of the character under examination (at look_cur), initialize its pointer to a previous occurrence to the address of the tracktab slot pointed to by the lookup table pointer and initialize the lookup table pointer to the address of the new tracktab slot (the most recent occurrence of the pair of bytes).

The token generator module 36 assumes the task of creating the tokens that represent sequence of not compressed characters (nctokens) or matches/compressed (ctoken). It also writes these tokens to the output string 14. The token generator module 36 also modifies the expansion schemes used to write nclen, mlen and offset values based on the position of the look pointer in the input string.

Figure 2:
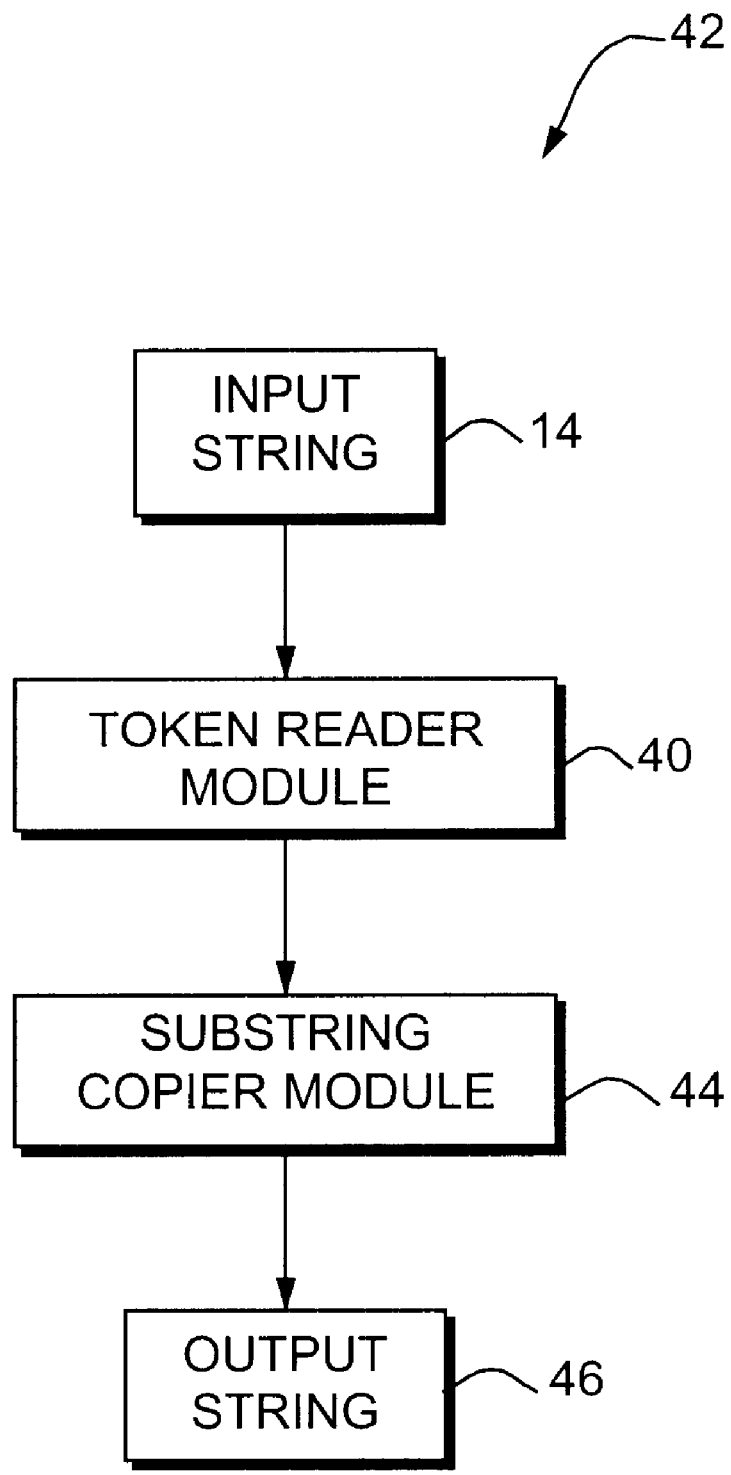
FIG. 2 is a block diagram of the decompression system according to the present invention.

The token reader module 40, FIG. 2, is part of the decompressor 42. It reads tokens from the input string 14 (which is the output string of the compressor 10) and extracts nclen, mlen and offset values. The token reader module 40 also tells the substring copier module 44 how many characters to write to the output string 46 and where to get those characters.

Like all LZ77 compressors, the present invention has a window of characters that can be referenced, and characters beyond the window cannot be used for compression. A memory efficient way of storing the tracktab array and the input string is as a circular buffer. In this context, a fixed number of tracktab slots are used and old slots are replaced by the newer slots.

Figure 5:
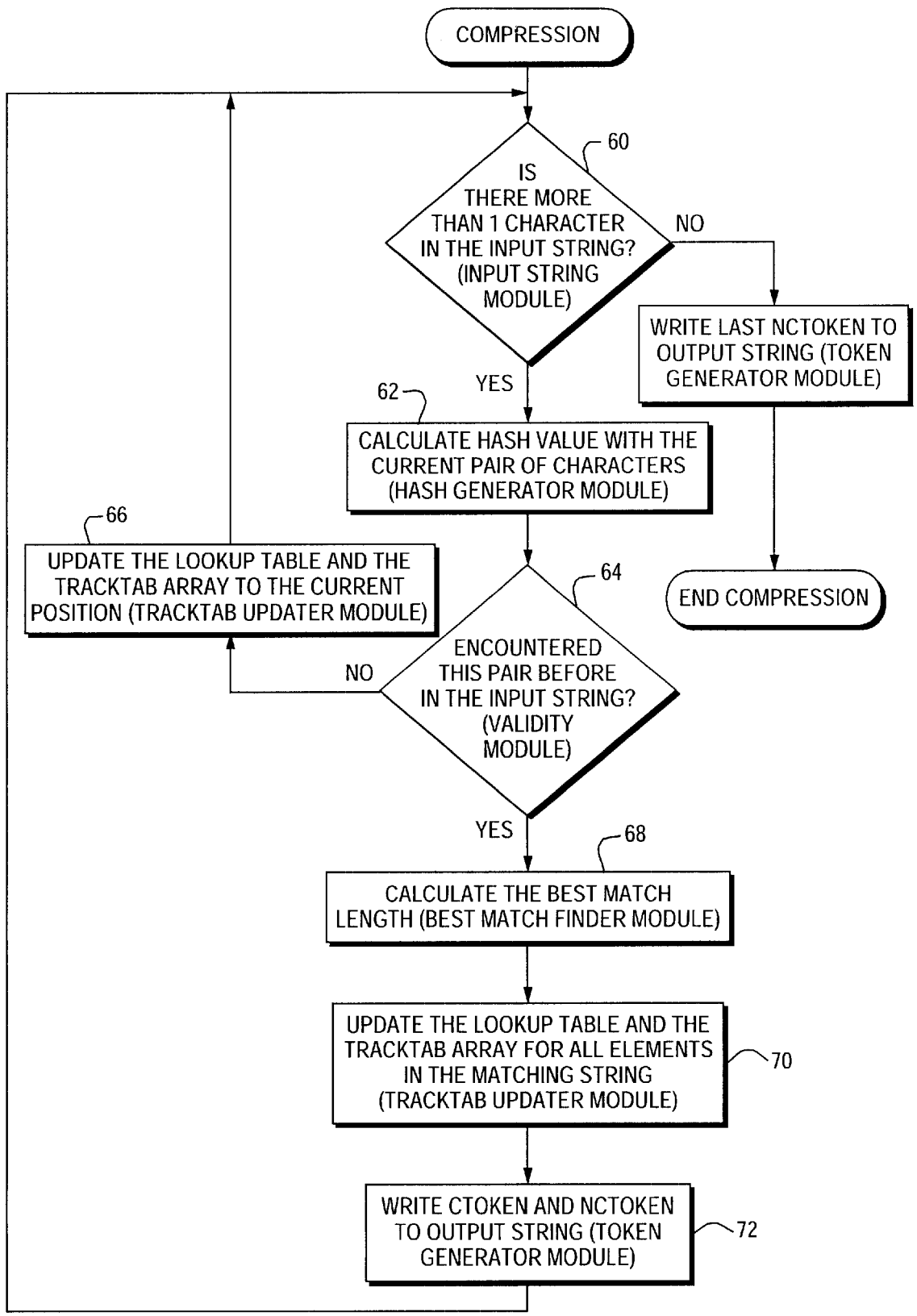
FIG. 5 is a high level flow chart of the compression process in accordance with the method and system of the present invention.

The steps used by the method of the present invention to compress data are fairly simple. They can be summarized as follows and as shown in FIG. 5: after determining that there is more than one (1) character in the input string, act, 60 and calculating a hash value on the current pair of characters being examined, act 62, the method processes characters by checking if they have been seen before in the input string, act 64. If they haven't, add them to the lookup table, act 66, and if they have, find the longest match possible with the previous occurrence of the character(s) under examination, act 68, and update the lookup table, act 70. When a match is found, write an nctoken representing the characters that could not be compressed (if there are any characters between the last match and this one) and a ctoken to represent the match, act 72. Repeat this process until there are no characters left in the input string.

The method of the present invention checks for previous encounters of pairs of characters and uses a lookup table 18, FIG. 4, for that purpose. The lookup table references simply-linked lists 31 of the same pair of characters. The first node 50 of the list references the most recent occurrence of the pair of characters. The binary representation of nclen, mlen, and offset values are given by a vector of integers called "expansion schemes". Expansion schemes produce variable length codes that are efficient in representing values that obey strictly decreasing probability distribution functions. Expansion schemes also provide a highly economical way, in terms of memory usage, of storing bit representations.

Essentially, the method of the present invention works on the following principle: It is a truism that the number of times that each length is met in compression is greatly decreasing following the value of the length. For example, many tests have demonstrated that approximately 50% of the time one is writing a length of 2, 25% of the time of 3, 12% of the time of 4 and so on, by dividing each increase of one of the length. Consequently, for the purpose of the present invention, it is essential to maximize the gain as much as possible on all of the short sequences since they arise much more frequently. This, of course, results in a penalty for lengths greater than 7, but these are very infrequent, i.e. between 5% and 10% of the time.

Consequently, the method of the present invention is thus quite appropriate for the compression of small sequences such as those that would be found on a packet of data on a network, where the length is generally smaller. Furthermore, since the compression is directed to small sequences, one must maximize the writing of the match length, not compressed length and offset as a function of the size of the data.

Figure 9:
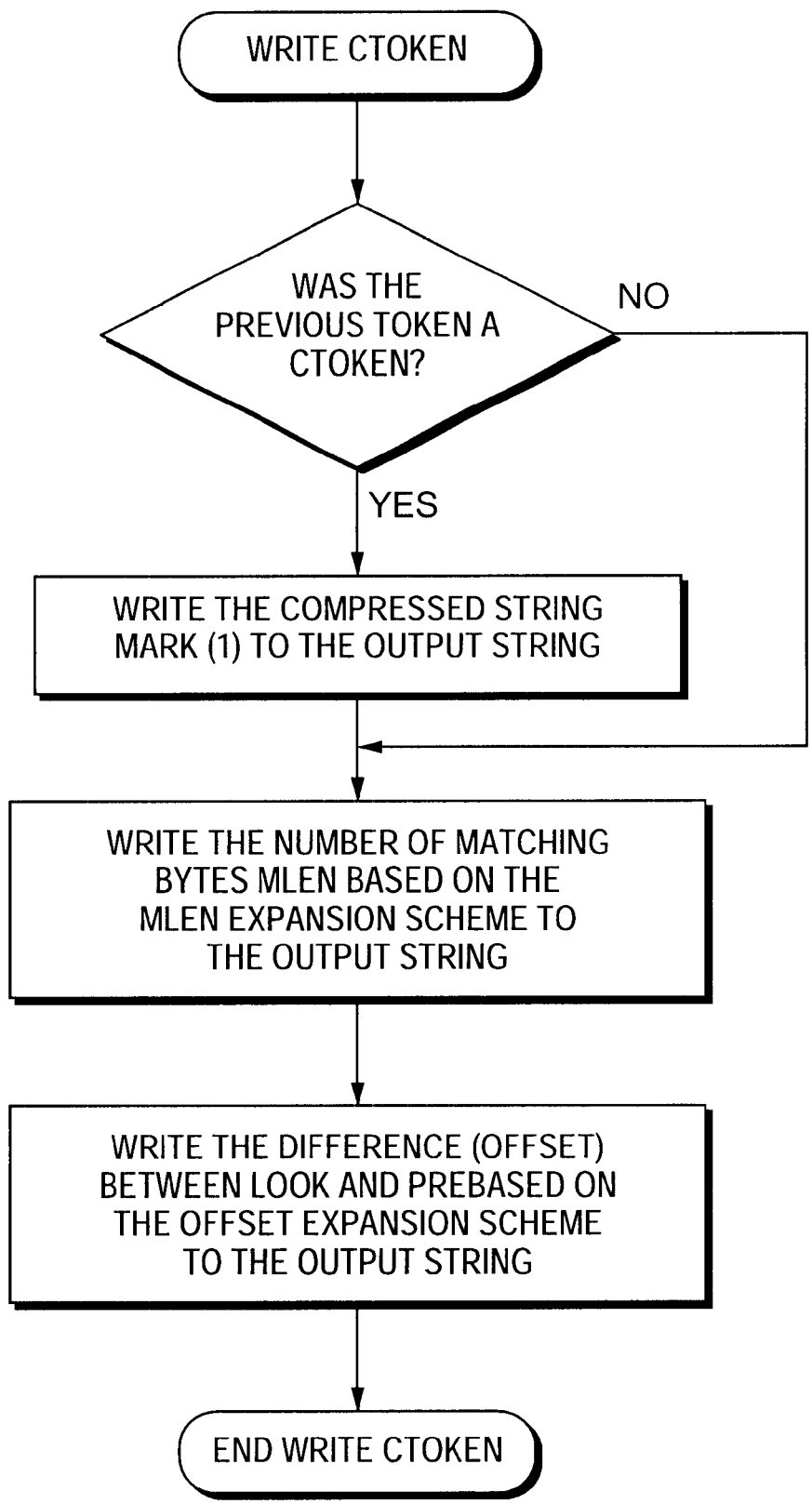
FIG. 9 is a detailed flow chart of the Write NCToken subroutine of the present invention
Figure 10:
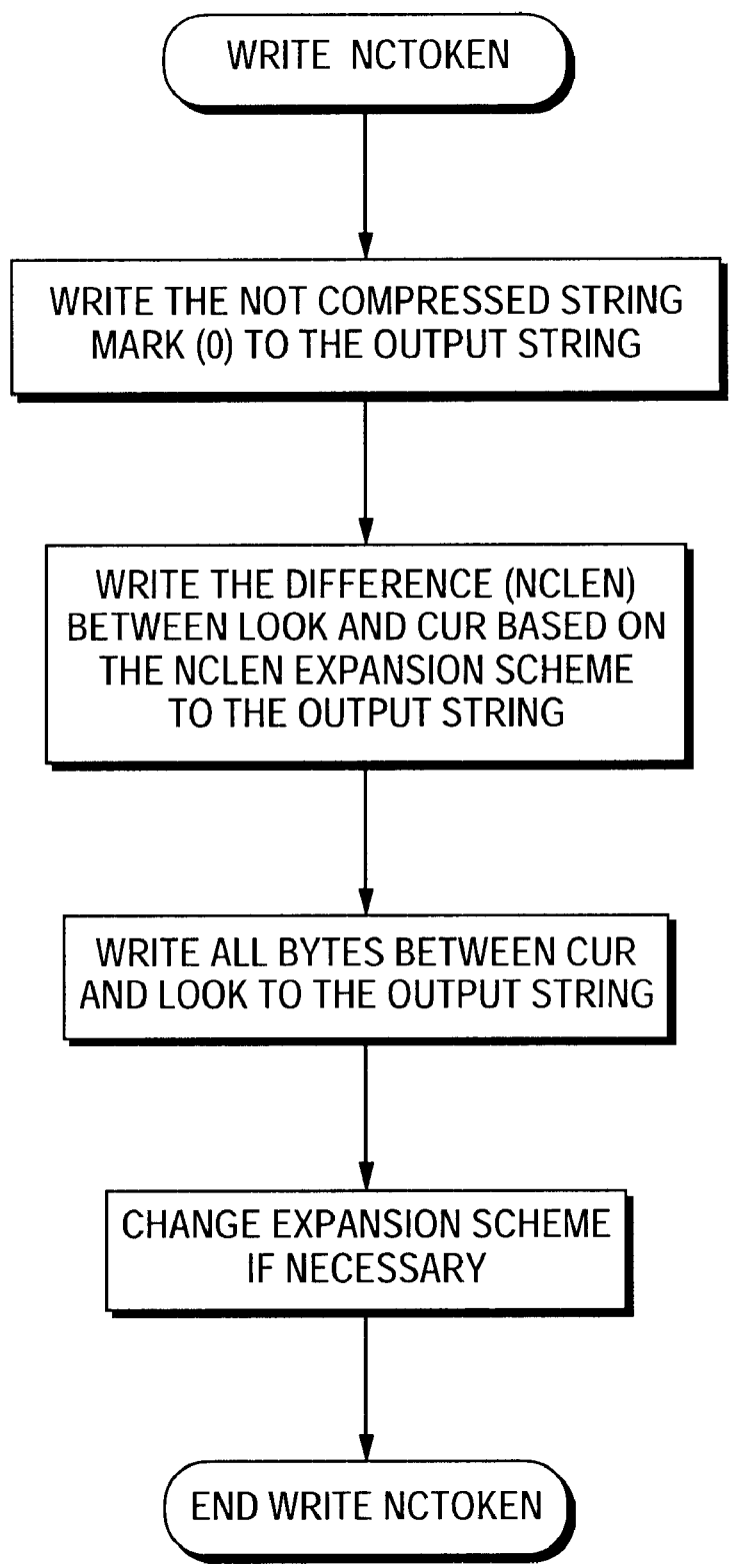
FIG. 10 is a detailed flow chart of the Calculate Hash subroutine of the present invention.
Figure 11A:
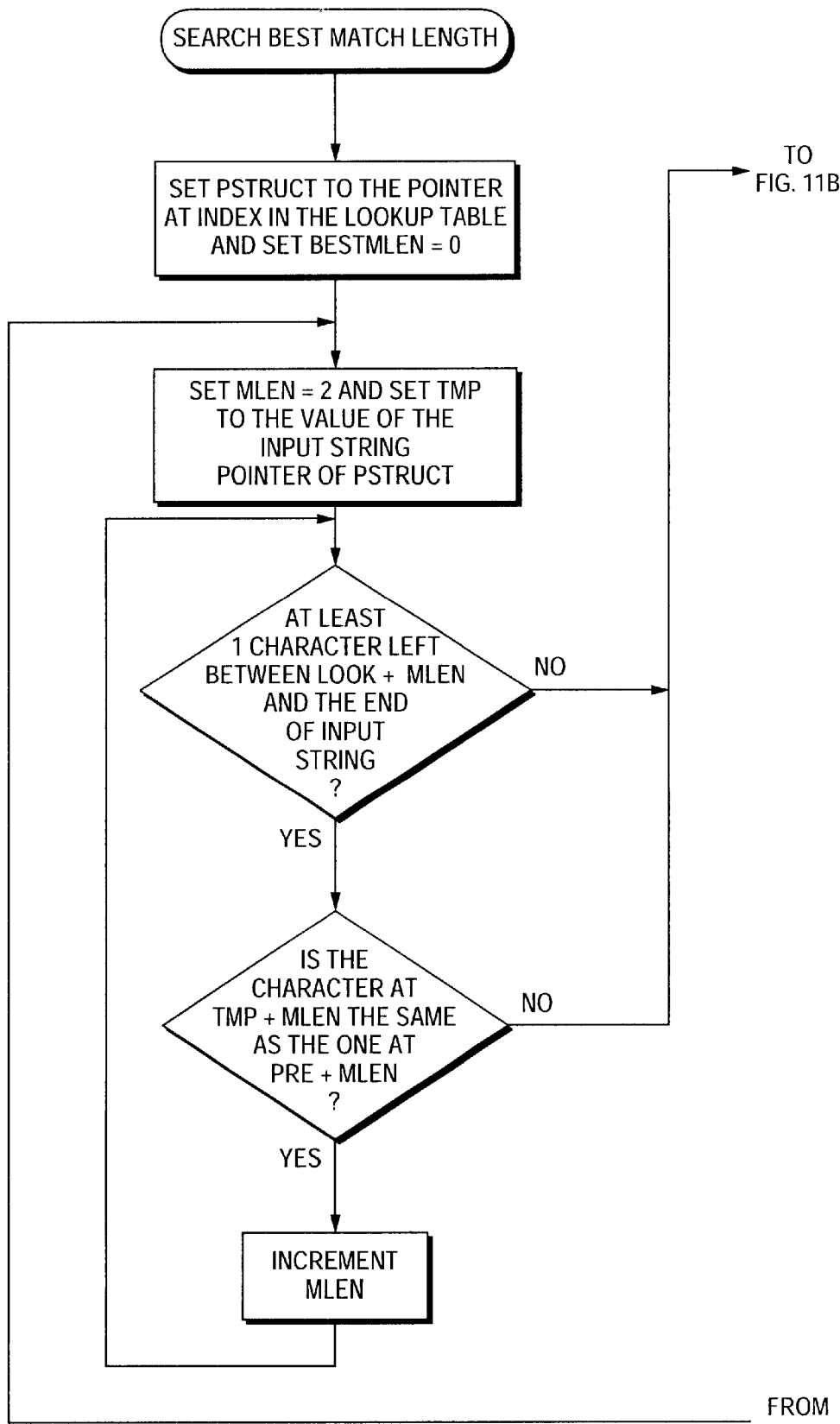
FIG. 11 is a detailed flow chart of the procedure to find the longest matching string in accordance with one feature of the present invention.
Figure 11B:
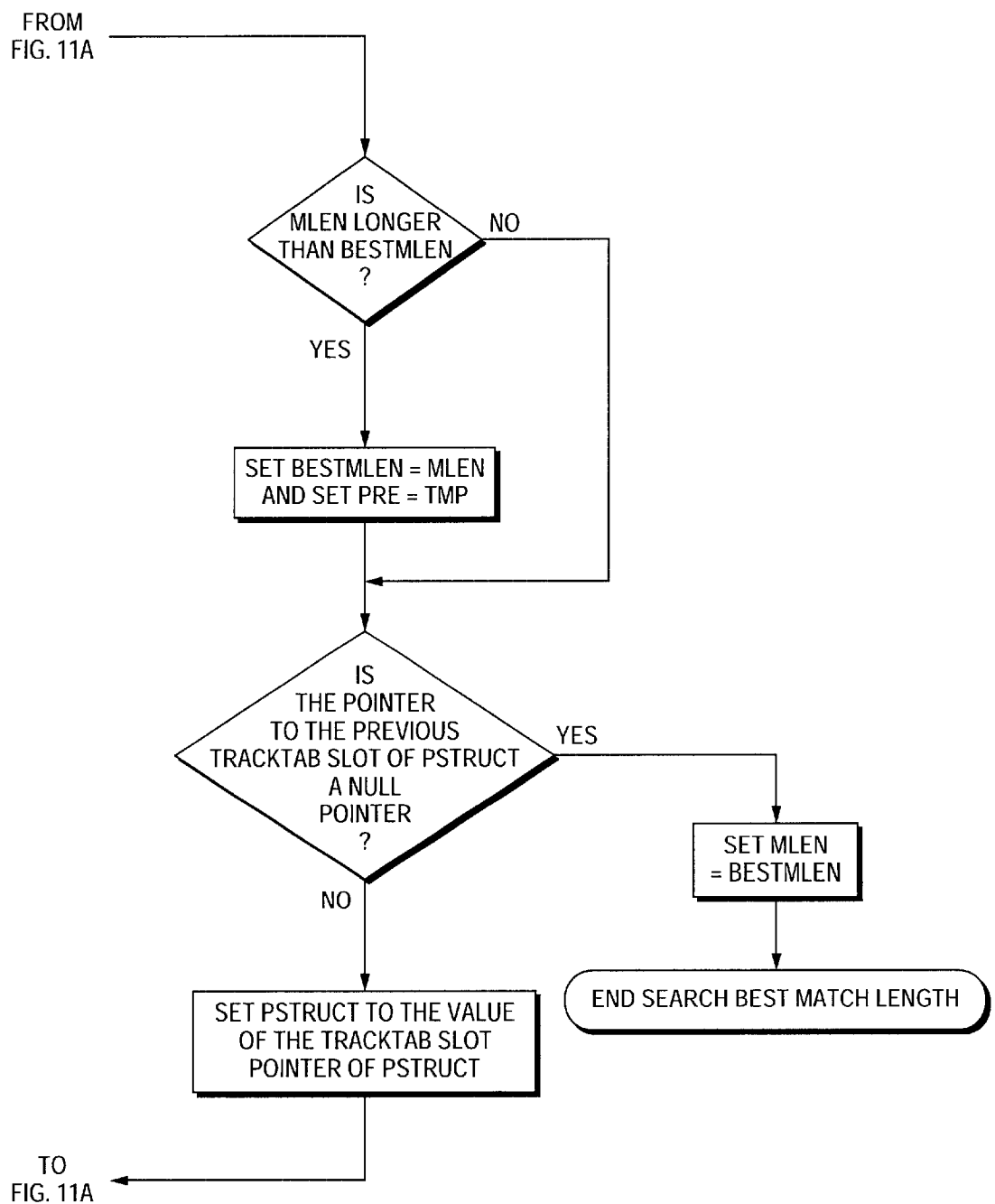
Figure 12A:
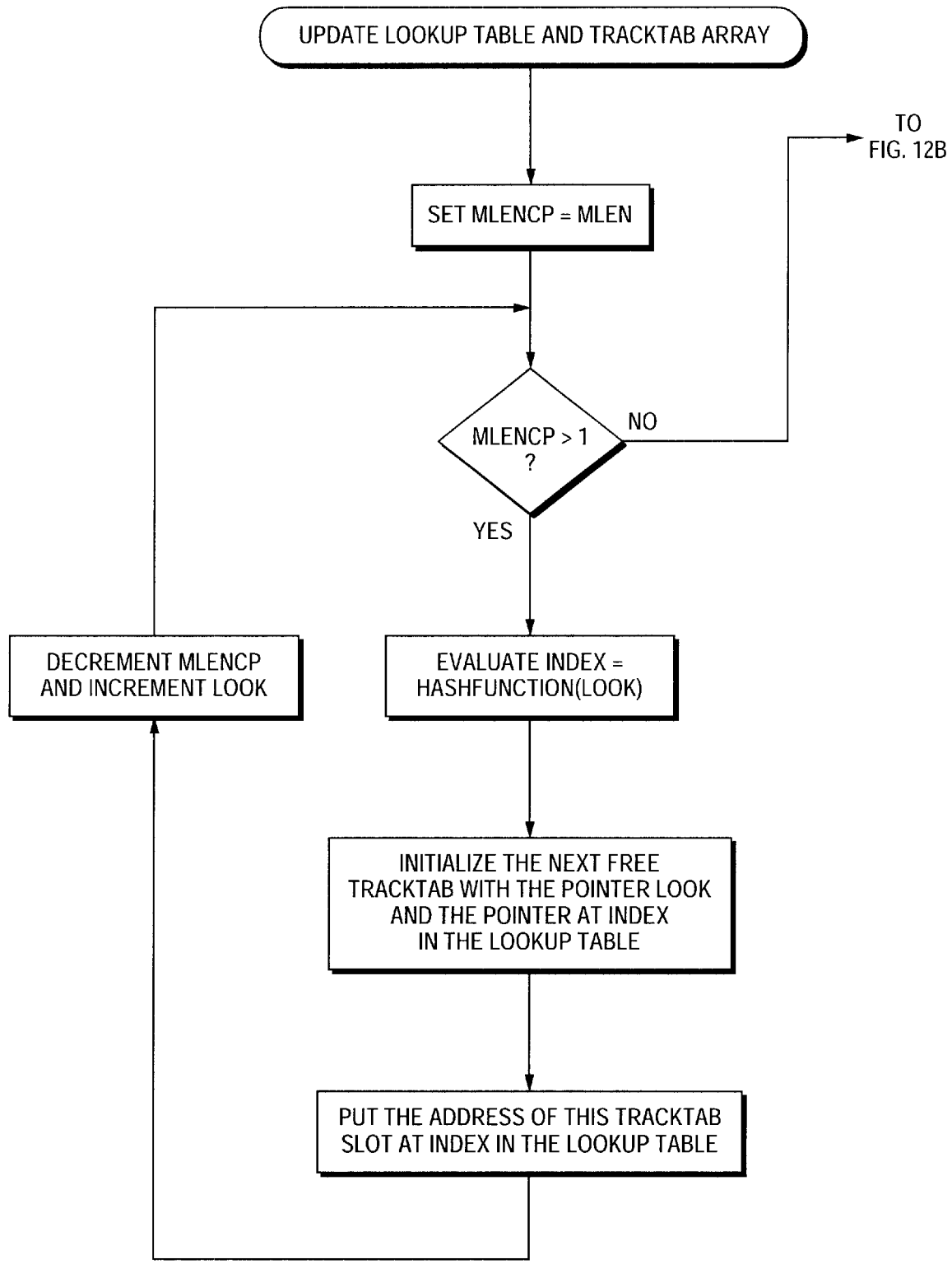
FIG. 12 is a detailed flow chart of the procedure to update the lookup table and the tracking table.
Figure 12B:
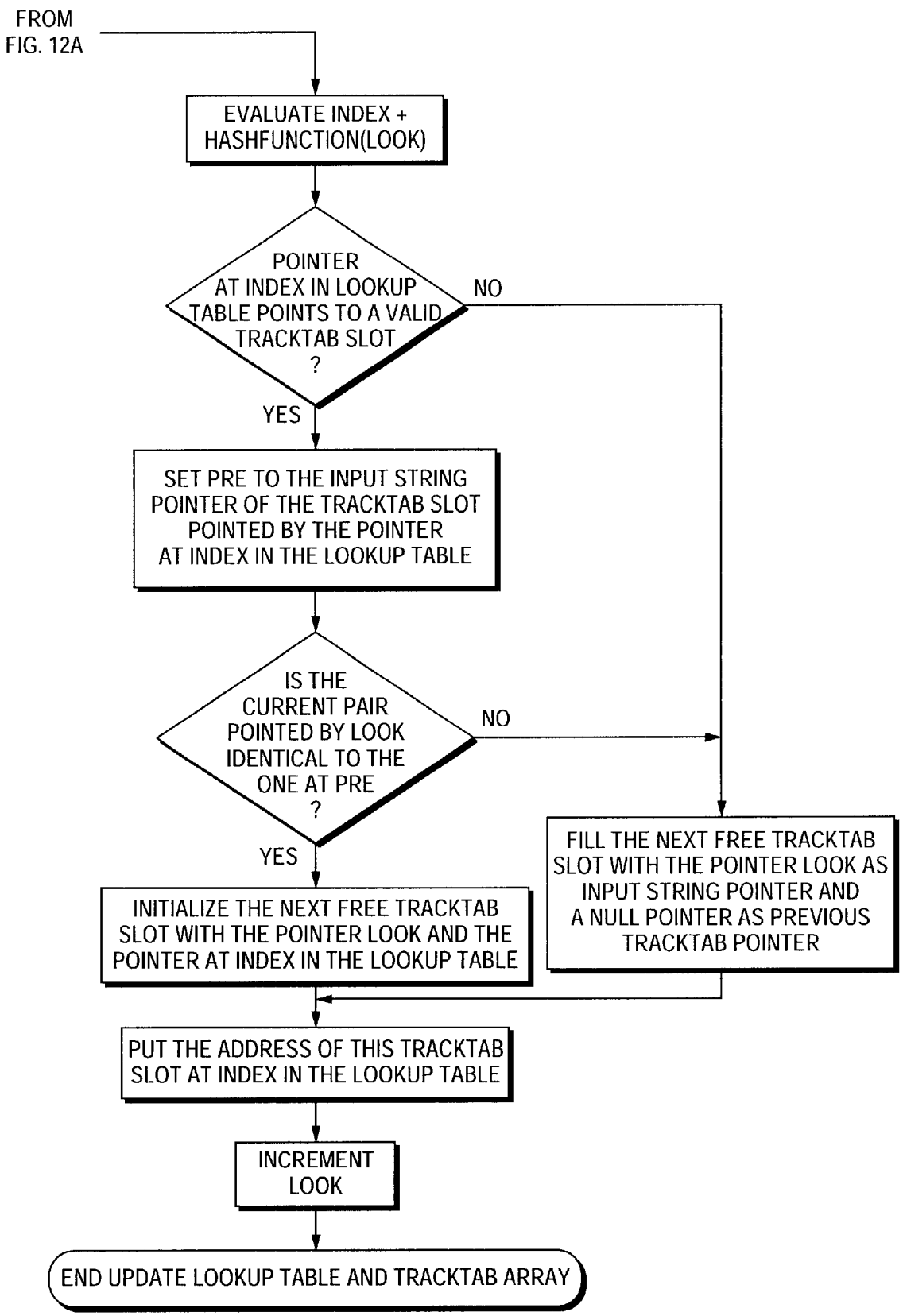

The method of the present invention proceeds as follows to differentiate between sequences of characters and matches (pairs of numbers <length, offset>). If the bit read is a 0 then a sequence of characters and a match are next, if the bit read is a 1 then a match is next. This works because two consecutive sequences of characters can be considered as one, that is "<abra><cada>" is equivalent to "<abracada>". Since a match always follows a sequence of characters only one bit is needed to distinguish between "<seq><mlen, offset>" and "<mlen,offset>". It is also necessary to know the length of the sequence of characters. This is usually called a not compressed length or in short nclen. An nctoken corresponds to the bit indicating the sequence, the nclen and the characters themselves. A compressed token or ctoken, is comprised of a bit indicating the sequence, if it immediately follows another ctoken, and the match length and offset pair or mlen and offset in short form. The method of writing a ctoken and an nctoken are shown and described in detail in FIGS. 9 and 10.

Figure 6:
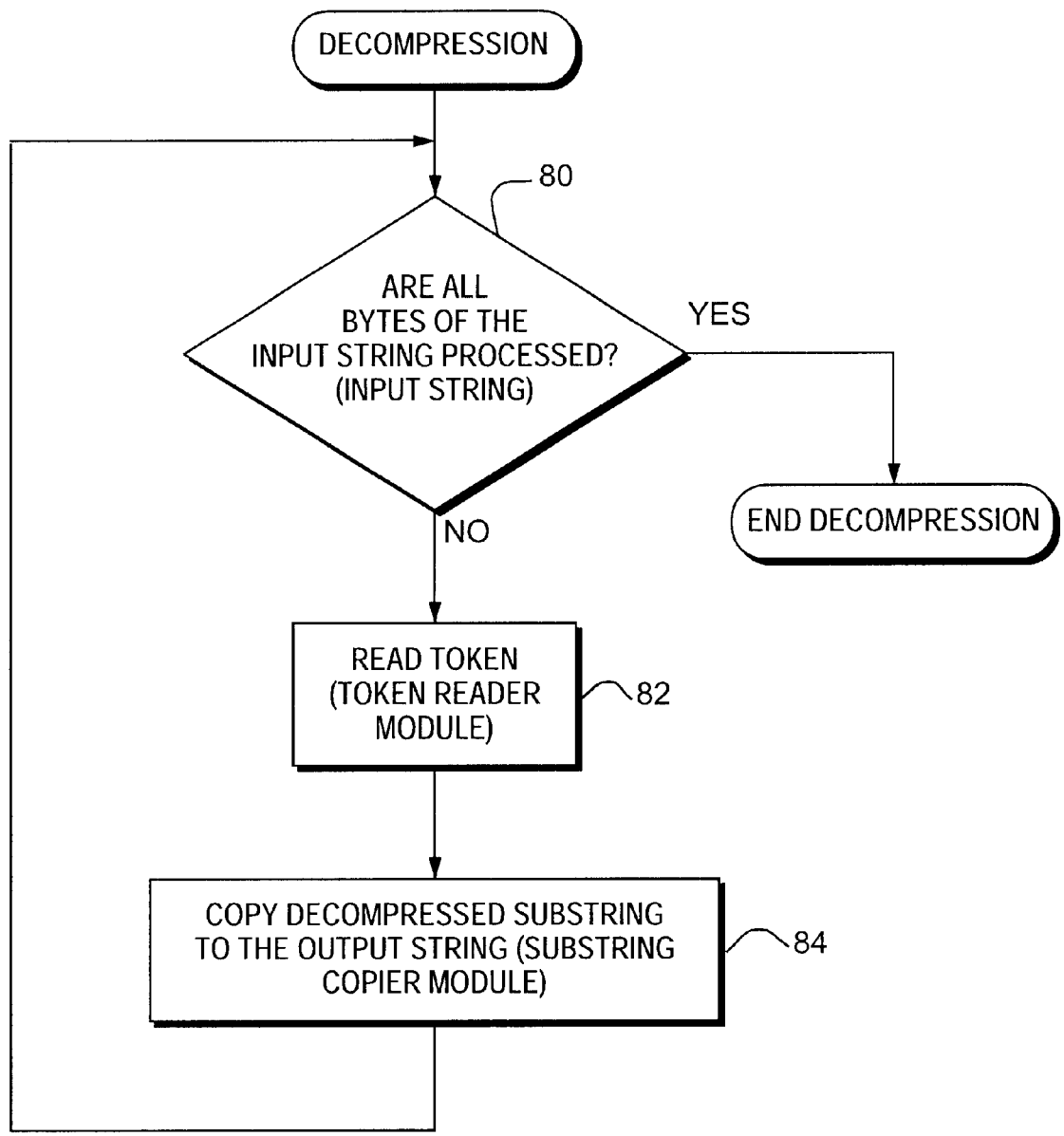
FIG. 6 is a high level flow chart of the decompression process in accordance with the method and system of the present invention.
Figure 7A:
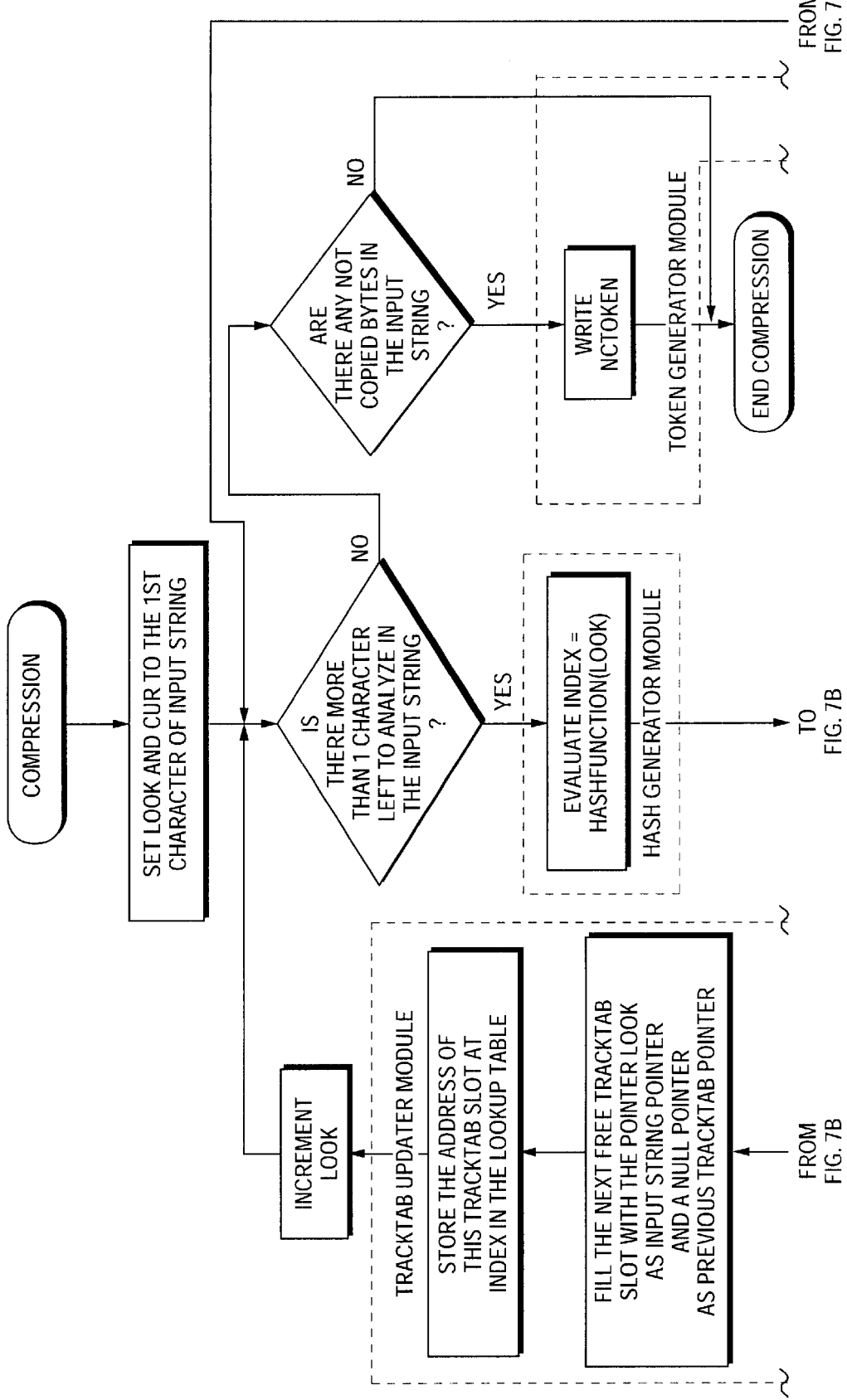
FIG. 7 is a detailed flow chart of the compression process in accordance with the method and system of the present invention.
Figure 8A:
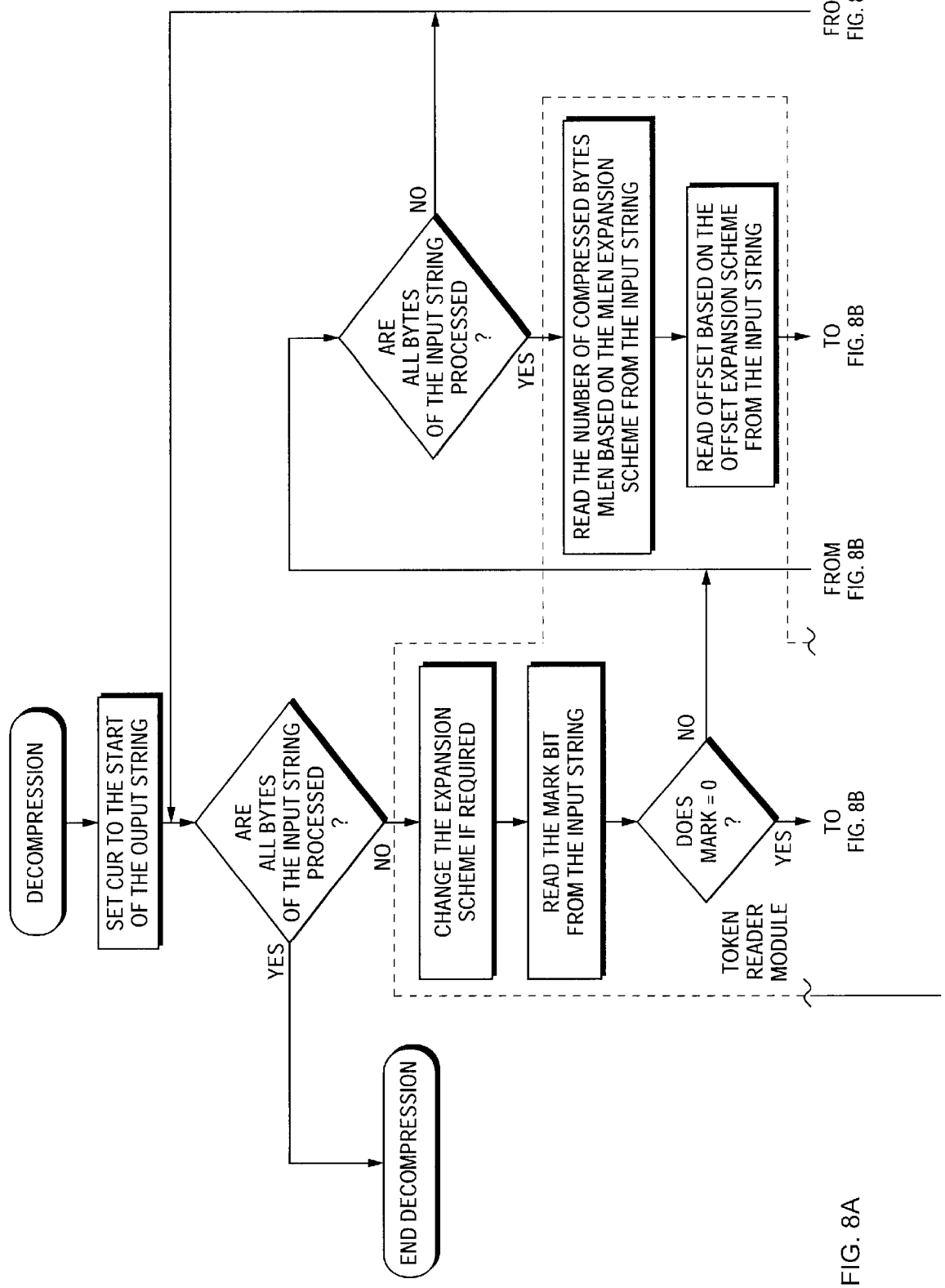
FIG. 8 is a detailed flow chart of the decompression process in accordance with the method and system of the present invention.
Figure 8B:
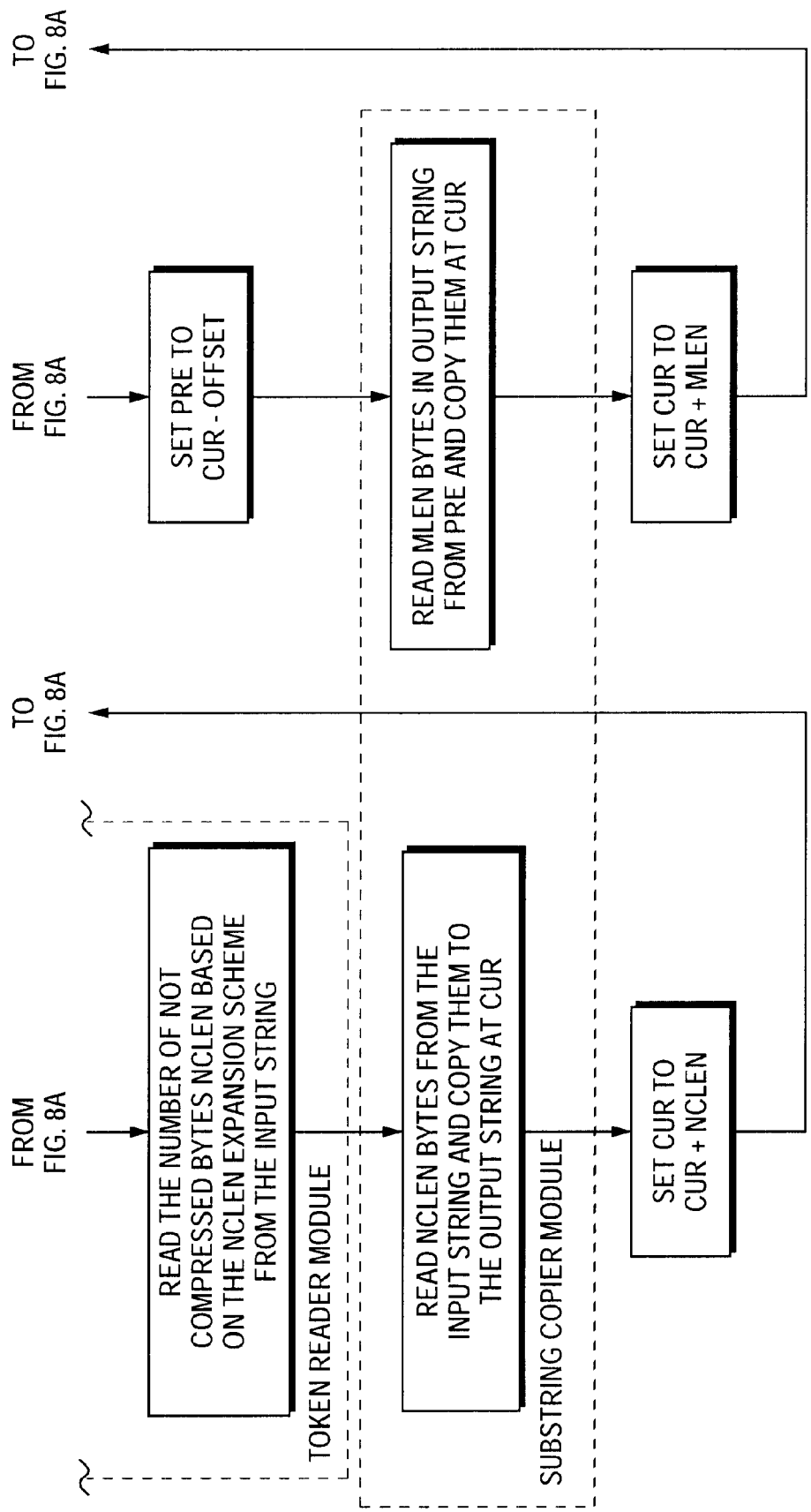

The decompressor associated with the present invention is quite simple. In this context, the input string is comprised of tokens representing the original string and at the end, the output string will contain the decompressed string. If there are bytes remaining to be read in the input string, act 80, FIG. 6, the decompressor reads a token, act 82. If the token is a nctoken, then the decompressor reads the length of the sequence, copies those characters to the output string, reads the ctoken that follows and copies mlen characters at the given offset to the output string, act 84. If the token is a ctoken, the decompressor copies mlen characters at the given offset to the output string, act 84. This goes on until all of the tokens are read.

One feature of the method and system of the present invention is in the way to assign binary representations to lengths and offsets. This can be described as the dynamic modification of expansion schemes. Expansions schemes are vectors of integers that can be expanded to obtain all the binary representations of the desired values. Depending on the number of bytes that have been processed, the compressor changes its expansion schemes to reflect changes in the probability distribution of the lengths and offsets.

Consider the compression of a stream or input string of 1000 characters. It can be seen that not all the values are possible for the length and offset of a match. For example, if the two characters under study are the fifth and sixth characters, we know it is impossible to have a match with an offset longer than 4 and or a match length longer 996. Since it is highly inefficient to assign binary representations to values that will not be used, we define expansion schemes that are optimal for a given range in the input string. Each element a[i] of the mlen and nclen expansion scheme is a increment to the number of bits to use for the next $2^{a[i]}-1$ values. By means of example, we assume an expansion scheme is $\{1,1,2\}$, this means that the first value $2^1-1$ will be represented on 1 bit. Since the second element of the expansion scheme is a 1, the next value will be represented on two bits (the number of bits of the previous value plus 1). The last three values will be represented on 4 bits. The values we can represent with this scheme are shown in Table 1 below:

TABLE 1

Example of the expansion of the {1, 1, 2} expansion scheme

| | vector | | | |
|---|---|---|---|---|
| value | 1 | 1 | 2 | number of bits |
| 1 | 1 | | | 1 |
| 2 | 0 | 1 | | 2 |
| 3 | 0 | 0 | 01 | 4 |
| 4 | 0 | 0 | 10 | 4 |
| 5 | 0 | 0 | 11 | 4 |

As mentioned before, expansion schemes are an efficient way of storing the binary representation of the values to be coded. In the previous example, we would only need to store three numbers ($\{1,1,2\}$) instead of 5 binary representations and their length.

As more and more bytes in the input are processed, the maximum possible offset and match length value respectively increase and decrease. We can take advantage of this in dynamic all modifying the expansion schemes for both the offset and match length. We can also define expansion schemes to represent length of uncompressed sequences. By calculating the probability distributions of the match lengths, offsets and lengths of not compressed sequences based on the position in the input string, the present invention can find the optimal expansion schemes to use for each range of positions.

The present invention makes use of vectors of expansion schemes to enable the compressor to dynamically change the codes associated to the match lengths, the offsets, and the length of the not compressed sequences. Three distinct vectors are used because the probability distributions for these three elements are quite different from one another and different vectors allow the codes to be adapted to the distributions. The number of expansion schemes per vector has to be the same as the desired number of dynamic changes in the codes (it can go from 1 to N, the maximal size of the data to compress). This number can be chosen arbitrarily or can be determined by a proper statistical analysis. The position where the compressor changes from an expansion scheme to the next can also be chosen arbitrarily or determined by a statistical analysis.

The following is a C code style example of code which provides a vector of the positions at which expansion schemes could be changed containing nineteen changes unsigned int bsizeswitch[19]={32, 64, 96, 128, 192, 256, 320, 384, 448, 512, 640, 768,896, 1024, 1280, 1536, 2048, 3072, 4096};

This means that when more than 31 bytes of the input have been processed, the compressor will change the current expansion scheme to the second expansion scheme, when more than 63 bytes have been processed it will change the expansion scheme to the third one and this goes on until the end of the input is reached. When no changes occur, the same expansion scheme is conserved. A specific vector of positions could also exist for each type of codes that we wish to change (match lengths, offsets, etc).

TABLE 2

Bit representations given by the mlen expansion scheme {1, 2, 4, 4, 7, 12}

| | vector | | | | | | number of |
|---|---|---|---|---|---|---|---|
| value | 1 | 2 | 4 | 4 | 7 | 12 | bits |
| 2 | 1 | | | | | | 1 |
| 3 | 0 | 01 | | | | | 3 |
| 4 | 0 | 10 | | | | | 3 |
| 5 | 0 | 11 | | | | | 3 |
| 6 | 0 | 00 | 0001 | | | | 7 |
| 7 | 0 | 00 | 0010 | | | | 7 |
| 8 | 0 | 00 | 0011 | | | | 7 |
| ... | ... | ... | ... | | | | ... |
| 20 | 0 | 00 | 1111 | | | | 7 |
| 21 | 0 | 00 | 0000 | 0001 | | | 11 |
| ... | ... | ... | ... | ... | | | ... |
| 35 | 0 | 00 | 0000 | 1111 | | | 11 |
| 36 | 0 | 00 | 0000 | 0000 | 0000001 | | 18 |
| ... | ... | ... | ... | ... | ... | | ... |
| 162 | 0 | 00 | 0000 | 0000 | 1111111 | | 18 |
| 163 | 0 | 00 | 0000 | 0000 | 0000000 | 000000000001 | 30 |
| ... | ... | ... | ... | ... | ... | ... | ... |
| 4257 | 0 | 00 | 0000 | 0000 | 0000000 | 111111111111 | 30 |

Match lengths (mlen) could be written according to the following vector of ion schemes:

unsigned int mlen_exp[ ][6]={{1, 2, 4, 4, 7, 12}, {1, 2, 5, 6, 8, 12}, {1, 2, 4, 4, 7, 12}, {1, 2, 5, 7, 9, 12}, {1, 2, 5, 7, 9, 12}, {1, 2, 5, 7, 9, 12}, {1, 2, 5, 7, 9, 12}};

These vectors contain 7 different expansion schemes of 6 integers each. Normally, tual values contained in the expansion schemes are assigned according to the results of a analysis of sample data. The expansion schemes can contain any number of integers (as long as there are enough codes to represent all the possible values) and the vector of expansion schemes should contain a number of expansion schemes equal to the number of times a dynamic change of codes is desired.

Binary codes representing match lengths start at the value 2 because the minimum match length that can be used is of length 2. In other words, no binary representations are wasted for the values 0 or 1 for mlen since they would not be used anyway.

TABLE 3

Bit representations given by
the nclen expansion scheme {1, 2, 2, 3, 5, 12}

| | vector | | | | | | number of |
|---|---|---|---|---|---|---|---|
| value | 1 | 2 | 2 | 3 | 5 | 12 | bits |
| 1 | 1 | | | | | | 1 |
| 2 | 0 | 01 | | | | | 3 |
| 3 | 0 | 10 | | | | | 3 |
| 4 | 0 | 11 | | | | | 3 |
| 5 | 0 | 00 | 01 | | | | 5 |
| 6 | 0 | 00 | 10 | | | | 5 |
| 7 | 0 | 00 | 11 | | | | 5 |
| 8 | 0 | 00 | 00 | 001 | | | 8 |
| ... | ... | ... | ... | ... | | | ... |
| 14 | 0 | 00 | 00 | 111 | | | 8 |
| 15 | 0 | 00 | 00 | 000 | 00001 | | 13 |
| ... | ... | ... | ... | ... | ... | | ... |
| 45 | 0 | 00 | 00 | 000 | 11111 | | 13 |

TABLE 3-continued

Bit representations given by
the nclen expansion scheme {1, 2, 2, 3, 5, 12}

| value | vector | | | | | number of bits |
|---|---|---|---|---|---|---|
| | 1 | 2 | 2 | 3 | 5 | 12 | |
| 46 | 0 | 00 | 00 | 000 | 00000 | 000000000001 | 25 |
| ... | ... | ... | ... | ... | ... | ... | ... |
| 4140 | 0 | 00 | 00 | 000 | 00000 | 111111111111 | 25 |

Lengths of not compressed bytes sequences (nclen) are also coded using expansion schemes. However, their vectors are different since probabilities are different. Not compressed lengths (nclen) could be written according to the following vector expansion schemes:

unsigned int nclen_exp[ ][6]={{1, 2, 3, 3, 5, 12}, {1, 2, 3, 4, 5, 12}, {1, 2, 4, 5, 7, 12}, {1, 2, 4, 5, 7, 12}, {1, 2, 4, 6, 7, 12}, {1, 2, 5, 6, 7, 12}};

Table 3 gives an example of nclen values and their binary representation given by the expansion scheme {1,2,2,3,5, 12}.

The offset codes also dynamically change similarly using the same principle. The difference between the codes generated for match lengths and offsets is that the offsets are prefixed by a fixed bit length indicator, and the integers of the expansion do not have the same meaning. In the preferred embodiment, the length of the field is set at three bits.

TABLE 4

Bit representations given by the offset
expansion scheme {1, 1, 1, 1, 1, 1, 2, 4}

| offset | offset code | | number of bits |
|---|---|---|---|
| | indicator | rest | |
| 1 | 000 | 0 | 4 |
| 2 | 000 | 1 | 4 |
| 3 | 001 | 0 | 4 |
| 4 | 001 | 1 | 4 |
| 5 | 010 | 0 | 4 |
| 6 | 010 | 1 | 4 |
| 7 | 011 | 0 | 4 |
| 8 | 011 | 1 | 4 |
| 9 | 100 | 0 | 4 |
| 10 | 100 | 1 | 4 |
| 11 | 101 | 0 | 4 |
| 12 | 101 | 1 | 4 |
| 13 | 110 | 00 | 5 |
| 14 | 110 | 01 | 5 |
| 15 | 110 | 10 | 5 |
| 16 | 110 | 11 | 5 |
| 17 | 111 | 0000 | 7 |
| ... | ... | ... | ... |
| 32 | 111 | 1111 | 7 |

The three bit "indicator" tells the decompressor how many bits to read to determine the offset. The number of bits to read are the integers of the expansion scheme and their position corresponds to the three bits indicator. The values used by the previous indicators are also subtracted from the desired value to waste as little code space as possible. The following is an example of expansion schemes of offsets unsigned int offset_exp[ ][8]={{1, 1, 1, 1, 1, 1, 2, 4}{1, 1, 2, 3, 3, 3, 3, 5}{2, 4, 4, 4, 4, 4, 6, 6}, {2, 5, 5, 5, 6, 6, 7, 7}, {4, 5, 5, 6, 7, 7, 8, 8}, {5, 6, 8, 8, 8, 8, 9, 11}}(for an offset 0 to 31) (for an offset of 32 to 63, etc.)

If the offset expansion used is {1,1,2,3,3,3,3,5}), the value 5 will be coded as 01000. The procedure is as follows: for each of the numbers offset_exp[1][i] of the expansion calculate $2^{(offset\_exp[1][i])}$ and check if it is larger than the number to code. If it is larger, subtract that value from the number to code, increment i and repeat this process until the number obtained is less than $2^{(offset\_exp[1][i])}$. Subtract 1 from the rest of the number to code (this is because we don't need a code to represent an offset of zero so we subtract this possibility). Write i on three bits and write the rest of the number on offset_exp[1][i] bits. In the previous case, this gives $5-2^1-2^1-1=0$ with i=2 so the binary representation is 01000, that is 2 on three bits concatenated with the value 0 on 2 bit. Table 4 is an example of offset values and their binary representation as given by the expansion scheme {1,1,1,1,1,1,2,4}.

Figure 13:
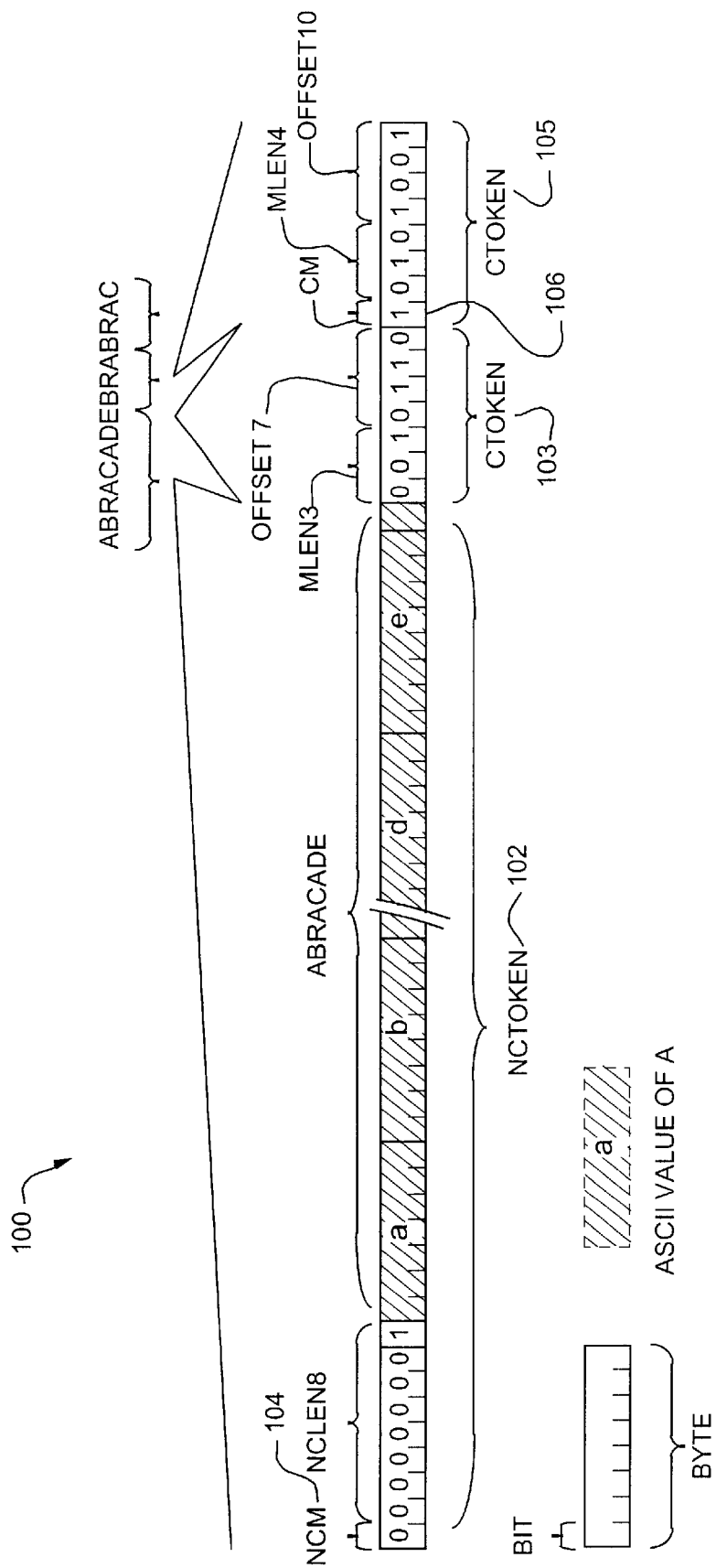
FIG. 13 is a schematic representation of an output string containing various uncompressed data and tokens in accordance with one feature of the present invention.

An example of a partial output string 100, FIG. 13 illustrates the makeup of the output string in terms of characters (in the case of no match) and tokens (both match and no match tokens.) Suppose the character string to compress is "abracadebrabrac", the compression steps will be the following (note that binary numbers are appended with the letter "b" to distinguish them from standard base 10 numbers): the hash generator generates an index with the first two (2) characters "ab"; the validator determines if this pair of characters occurred before. In the present example, they have not therefore the lookup table and the tracking table are updated to contain the reference to this pair of characters. The compressor then studies the next pair of characters ("br") followed by the next pair of characters ("ra") and so on and as long as there is not a match, updates the data structures until it finds a match. The second time the pair of character string "br" is encountered, the validator detects a match. The best match finder calculates the length of the match and finds an mlen (matching length) of the three (3) characters "bra", the offset (the number of characters since the beginning of the previous match) is 7 and the number of not compressed characters (nclen) is 8 (that is, the characters "abracade").

The token generator will generate an nctoken 102 and a ctoken 103 to the output string 100. The nctoken is comprised of a mark (ncm) 104, (the bit 0 in this example) indicating a not compressed sequence, followed by the nclen 8 code and the ascii representation of the eight characters themselves. The ctoken 103 contains the mlen 3 code and the offset 7 code. The bit patterns are generated according the expansion schemes {1,2,2,3,5,12} for the nclen, {1,2,4,4,7, 12} for the mlen and {1,1,1,1,1,1,2,4} for the offset. The first level expansion schemes are used because the number of characters processed is lower than 32 characters (the first value of the bsizeswitch vector). This yields the code 00000001(b) for an nclen of 8,001(b) for an mlen of 3 and 0110(b) for an offset of 7.

The process starts again, now examining the next character string, the character pair "br". The validator detects a match, the best match finder calculates a match of length 3 ("bra") with the previous occurrence of "br", and a match length of 4 ("brac") with the first occurrence. The mlen of 4 is chosen as the best match, its offset is 10. The token generator will then output another ctoken 105. The ctoken 105 is comprised of a compressed mark cm 106 (the bit 1) since the last token was a ctoken, an mlen of 4 (written as 010(b)) and an offset of 10 (written as 1001(b)).

Modifications and substitutions by one of ordinary skill in the art are considered to be within the scope of the present invention, which is not to be limited except by the following claims.

The invention claimed is:
1. A system for compressing and decompressing an input string in real time, comprising:

a hash generator, responsive to a character string from said input string, for generating an index value as a function of said character string;

a look up table having a plurality of addressable storage locations, each said adjustable storage location storing a pointer to an adjustable storage location in a tracking table;

a validator, responsive to said index value generated by said hash generator and to said look up table, for determining whether or not said pointer stored in said look up table at an address corresponding to said index value is valid;

a best match finder, responsive to an indication from said validator that said data stored in said look up table is valid, for determining the length of the longest possible match between said character string and data from said input string;

a tracking table including a plurality of chained lists of addressable storage locations, each of said chained list of addressable storage locations including one or more storage locations for storing data; and a token generator, for creating a sequence of indications representing compressed and not compressed character strings from said input string, said indications being stored in an output string.

2. The system of claim 1 wherein said character string includes at least two characters from said input string.

3. The system of claim 2 wherein said at least two characters include at least two adjacent characters from said input string.

4. The system of claim 3 wherein said at least two adjacent characters include a character presently pointed to and a subsequent character.

5. The system of claim 1 wherein said determination that said index value is valid indicates that a character string has previously been encountered within said input string.

6. The system of claim 1 wherein said sequence of indications generated by said token generator represents whether or not a character string match has been detected, each said sequence of indications including one or more indications from the list consisting of: one or more characters not compressed; the length of the character string not compressed (nclen); the length of a matching character string (mlen); and the number of characters processed since the last match (offset).

7. The system of claim 6 wherein said token generator generates an nctoken indication if not compressed characters are present between the last match or start of the input string and a current match, and a ctoken indication if a character string match occurred.

8. The system of claim 7 wherein said ctoken includes an offset value code which can be dynamically, optimally represented based upon preselected criteria.

9. The system of claim 7 wherein said ctoken includes at least one of a character match length value code (mlen) and the number of characters processed since the last match (offset) which are dynamically optimally represented based upon preselected criteria.

10. The system of claim 7 wherein said nctoken includes a length of the not compressed character sequences code (nclen) which are dynamically, optimally represented based upon preselected criteria.

11. The system of claim 9 wherein said preselected criteria includes a preselected expansion scheme.

12. The system of claim 10 wherein said preselected criteria includes a preselected expansion scheme.

13. A system for compressing and decompressing an input string in real time, comprising:

a hash generator, responsive to a character string from said input string, for generating an index value as a function of said character string;

a look up table having a plurality of addressable storage locations, each said adjustable storage location storing a pointer to an adjustable storage location in a tracking table;

a validator, responsive to said index value generated by said hash generator and to said look up table, for determining whether or not said pointer stored in said look up table at an address corresponding to said index value is valid;

a best match finder, responsive to an indication from said validator that said data stored in said look up table is valid, for determining the length of the longest possible match between said character string and data from said input string;

a tracking table including a plurality of addressable chained lists of storage locations, each of said addressable chained lists of storage locations including one or more storage locations for storing pairs of datum, each of said pairs of datum including a first datum and a second datum, said first datum serving as a pointer to a location in said input string of a most previous occurrence of said character string being processed, said second datum including one of a null value and a pointer to another storage location in said chained list, said another storage location including a first and second datum, said first datum serving as a pointer to a location in said input string of a next most recent previous occurrence of said character string being processed; and a token generator, for creating a sequence of indications representing compressed and not compressed character strings from said input string, said indications being stored in an output string.

14. A system for compressing and decompressing an input string in real time, comprising:

a hash generator, responsive to a character string from said input string, for generating an index value as a function of said character string;

a look up table having a plurality of addressable storage locations, each said adjustable storage location storing a pointer to an adjustable storage location in a tracking table;

a validator, responsive to said index value generated by said hash generator and to said look up table, for determining whether or not said pointer stored in said look up table at an address corresponding to said index value is valid;

a best match finder, responsive to an indication from said validator that said data stored in said look up table is valid, for determining the length of the longest possible match between said character string and data from said input string;

a tracking table including a plurality of chained lists of addressable storage locations, each of said chained list of addressable storage locations including one or more storage locations for storing data; and a token generator, for creating a sequence of indications representing compressed and not compressed character strings from said input string, said indications being stored in an output string and represented in an optimal manner according to a preselected expansion scheme.

* * * * *